(12) United States Patent
Kwak et al.

(10) Patent No.: US 12,210,960 B2
(45) Date of Patent: Jan. 28, 2025

(54) NEUROMORPHIC CIRCUIT INCLUDING SPIKE REGULATOR BASED ON FLASH MEMORY

(71) Applicant: KOREA INSTITUTE OF SCIENCE AND TECHNOLOGY, Seoul (KR)

(72) Inventors: Joon Young Kwak, Seoul (KR); Suyoun Lee, Seoul (KR); Inho Kim, Seoul (KR); Jong-Keuk Park, Seoul (KR); Kyeong Seok Lee, Seoul (KR); Jaewook Kim, Seoul (KR); Jongkil Park, Seoul (KR); YeonJoo Jeong, Seoul (KR); Gyuweon Hwang, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 987 days.

(21) Appl. No.: 17/205,790

(22) Filed: Mar. 18, 2021

(65) Prior Publication Data

US 2022/0156565 A1  May 19, 2022

(30) Foreign Application Priority Data

Nov. 13, 2020  (KR) .................. 10-2020-0151652

(51) Int. Cl.
*G06N 3/063* (2023.01)
*G11C 16/04* (2006.01)
(Continued)

(52) U.S. Cl.
CPC ......... *G06N 3/063* (2013.01); *G11C 16/0466* (2013.01); *G11C 16/10* (2013.01); *H01L 29/792* (2013.01)

(58) Field of Classification Search
CPC ...................................................... G06N 3/063
(Continued)

(56) References Cited

U.S. PATENT DOCUMENTS

| | | | |
|---|---|---|---|
| 2020/0160146 A1* | 5/2020 | Oh | G06N 3/063 |
| 2021/0064963 A1* | 3/2021 | Murphy | G06N 3/048 |
| 2022/0004851 A1* | 1/2022 | Bohnstingl | G06N 3/084 |

FOREIGN PATENT DOCUMENTS

KR  20200088952 A  7/2020

* cited by examiner

*Primary Examiner* — Tomi Skibinski
(74) *Attorney, Agent, or Firm* — Rabin & Berdo, P.C.

(57) ABSTRACT

Embodiments of inventive concepts relate to a neuromorphic circuit including a flash memory-based spike regulator capable of generating a stable spike signal with a small number of devices. The neuromorphic circuit may generate a simple and stable spike signal using a flash memory-based spike regulator. Therefore, it is possible to implement a semiconductor neuromorphic circuit at low power and low cost by using the spike regulator of the present invention. Example embodiments of inventive concepts provide a neuromorphic circuit comprising a control signal generator for generating a control signal for generating a pulse signal; and a spike regulator for generating a spike signal in response to the control signal. Wherein the spike regulator comprises a first transistor for switching an input signal transmitted to one terminal to the other terminal in response to the control signal; and a first flash memory type transistor having a drain terminal connected to the other terminal of the first transistor and transferring the switched input signal to a source terminal as a spike signal.

20 Claims, 11 Drawing Sheets

(51) Int. Cl.
*G11C 16/10* (2006.01)
*H01L 29/792* (2006.01)

(58) Field of Classification Search
USPC .......................................................... 327/100
See application file for complete search history.

NEUROMORPHIC CIRCUIT INCLUDING SPIKE REGULATOR BASED ON FLASH MEMORY

CROSS-REFERENCE TO RELATED APPLICATIONS

This US non-provisional patent application claims priority under 35 USC § 119 to Korean Patent Application No. 10-2020-0151652, filed on Nov. 13, 2020, the entirety of which is hereby incorporated by reference.

BACKGROUND

The present invention relates to a semiconductor device, and more particularly, to a neuromorphic circuit including a spike regulator based on a flash memory.

The neuromorphic circuit is a semiconductor circuit based on an artificial nervous system that simulates a biological neural network. Neuromorphic circuits are mainly used for operations such as unsupervised learning methods using Spiking Neural Networks (SNNs). Here, the input of the spiking neural network (SNN) consists of a set of a plurality of spikes having a 1-bit level of '0' or '1' instead of a digital input value of several bits (input Spike train).

This type of input is transmitted to the neuron circuits of the spiking neural network (SNN), and the inner product of the neuron's pre-synapses and spikes may be accumulated at the membrane potential. When the membrane potential of a neuron circuit exceeds a specific threshold, neuron circuits of the same layer may be selected for a specific neuron circuit through a winner-take-all (WTA) process. In addition, after the selected neuron circuits initialize the membrane potential, a new spike is generated, and the spike signal is transmitted to other neuron circuits connected to the post-synapses of the neuron circuits.

In order to be implemented with a semiconductor chip, a neuron circuit must use a large number of transistors to generate a spike signal. Therefore, there is an inefficient problem in terms of chip area and power consumption.

SUMMARY

Embodiments of inventive concepts relate to a neuromorphic circuit including a flash memory-based spike regulator capable of generating a stable spike signal with a small number of devices. The neuromorphic circuit may generate a simple and stable spike signal using a flash memory-based spike regulator. Therefore, it is possible to implement a semiconductor neuromorphic circuit at low power and low cost by using the spike regulator of the present invention.

Example embodiments of inventive concepts provide a neuromorphic circuit comprising a control signal generator for generating a control signal for generating a pulse signal; and a spike regulator for generating a spike signal in response to the control signal. Wherein the spike regulator comprises a first transistor for switching an input signal transmitted to one terminal to the other terminal in response to the control signal; and a first flash memory type transistor having a drain terminal connected to the other terminal of the first transistor and transferring the switched input signal to a source terminal as a spike signal.

In example embodiments, the first transistor includes a PMOS transistor, and the control signal is provided to a gate terminal of the PMOS transistor.

In example embodiments, a gate of the first flash memory type transistor is grounded.

In example embodiments, the first flash memory type transistor includes a channel layer formed of molybdenum disulfide (MoS2), and a three-dimensional charge trapping layer in which aluminum oxide (AL2O3) and hafnium oxide (HfO2) layers are stacked.

In example embodiments, the neuromorphic circuit further comprises a program circuit for setting a level of a threshold voltage of the first flash memory type transistor.

Example embodiments of inventive concepts provide a neuromorphic circuit comprising a neuron array including neuron circuits that generate spike signals; and a synapse array including synapse circuits for processing and outputting the spike signals. Wherein each of the neuron circuits comprises, a control signal generator for generating a control signal for generating a pulse signal; a spike regulator generating the spike signal in response to the control signal; and a mode selection circuit for selecting an operation mode of the spike regulator. Wherein the spike regulator comprises, a first transistor for switching an input signal transmitted to one terminal to the other terminal in response to the control signal; and a first flash memory type transistor having a drain terminal connected to the other terminal of the first transistor and transferring the switched input signal to a source terminal as the spike signal.

In example embodiments, in the program mode of the first flash memory type transistor, the mode selection circuit provides a program voltage to a gate terminal of the first flash memory type transistor. The neuromorphic circuit further comprises a program circuit generating the program voltage and transmitting the program voltage to the mode selection circuit.

In example embodiments, the first transistor includes a PMOS transistor, and the control signal is provided to a gate terminal of the PMOS transistor. The first flash memory type transistor includes a channel layer formed of molybdenum disulfide (MoS2), and a three-dimensional charge trapping layer in which aluminum oxide (AL2O3) and hafnium oxide (HfO2) layers are stacked.

In example embodiments, in a normal mode, a gate terminal of the first flash memory type transistor is grounded. In the normal mode, a regulator voltage Vreg is provided to the gate terminal of the first flash memory type transistor, and the level of the input signal is higher than the difference between the regulator voltage and the threshold voltage of the first flash memory type transistor.

In example embodiments, the neuromorphic circuit further comprises at least one second flash memory type transistor connected in series to the first flash memory type transistor, gate terminals of the at least one second flash memory type transistor are grounded.

Example embodiments of inventive concepts provide a spike regulator of a neuromorphic circuit comprising a PMOS transistor for switching an input signal in response to a control signal; and a spike regulator including a first flash memory type transistor to output the switched input signal transmitted from the PMOS transistor as a spike signal.

In example embodiments, a gate terminal of the first flash memory type transistor is grounded. A regulator voltage is provided to a gate terminal of the first flash memory transistor, and a level of the input signal is higher than a difference between the regulator voltage and a threshold voltage of the first flash memory type transistor.

In example embodiments, the spike regulator of a neuromorphic circuit further comprises at least one second flash memory type transistor connected in series to the first flash memory type transistor. A gate terminal of the second flash memory type transistor is grounded.

In example embodiments, the first flash memory type transistor includes a channel layer formed of molybdenum disulfide (MoS2), and a three-dimensional charge trapping layer in which aluminum oxide (AL2O3) and hafnium oxide (HfO2) layers are stacked.

BRIEF DESCRIPTION OF THE DRAWINGS

The forgoing and other features of inventive concepts will be described below in more detail with reference to the accompanying drawings of non-limiting embodiments of inventive concepts in which like reference characters refer to like parts throughout the different views. The drawings are not necessarily to scale, emphasis instead being placed upon illustrating principles of inventive concepts. The drawings are as follows.

DETAILED DESCRIPTION

Hereinafter, an exemplary embodiment of the present disclosure will be described with reference to the accompanying drawings. In the following description, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

Also, in describing the components of the present disclosure, there may be terms used like the first, second, A, B, (a), and (b). These are solely for the purpose of differentiating one component from the other but not to imply or suggest the substances, order or sequence of the components. If a component were described as 'connected', 'coupled', or 'linked' to another component, it may mean the components are not only directly 'connected', 'coupled', or 'linked' but also are indirectly 'connected', 'coupled', or 'linked' via a third component.

Figure 1:
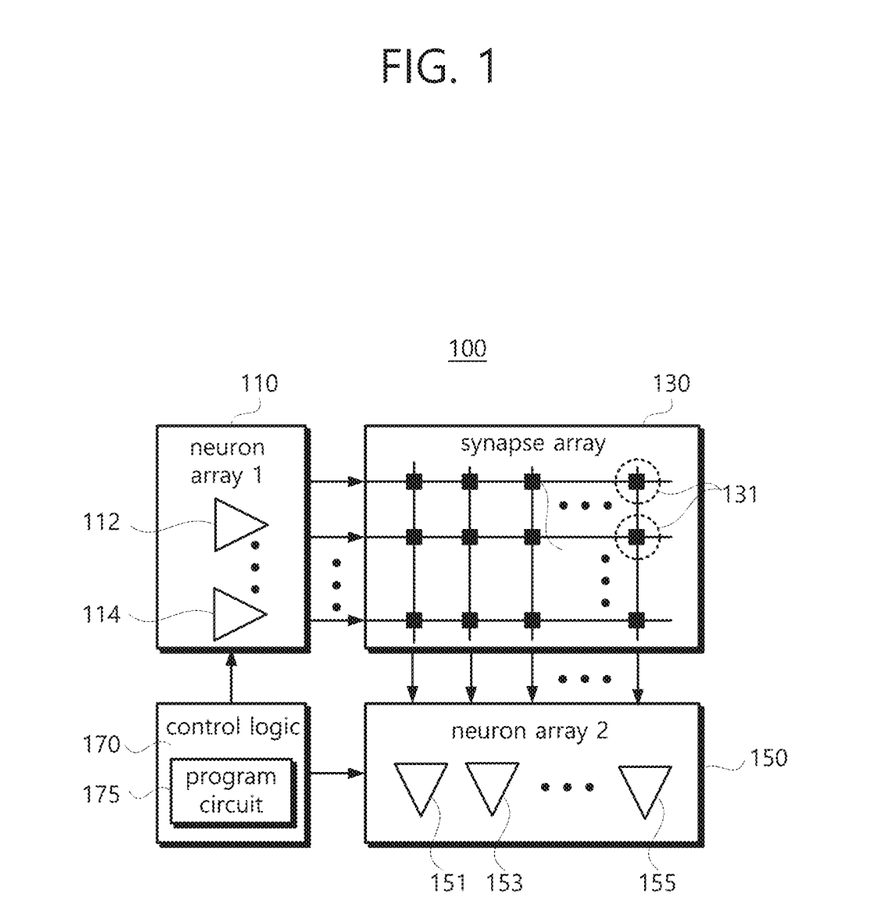
FIG. 1 is a block diagram illustrating a neuromorphic circuit according to an embodiment of the present invention.

FIG. 1 is a block diagram illustrating a neuromorphic circuit according to an embodiment of the present invention. The neuromorphic circuit 100 may include a first neuron array 110, a synapse array 130, a second neuron array 150, and a control logic 170.

The first neuron array 110 generates a spike signal and transmits it to the synapse array 130. The first neuron array 110 may include neuron circuits 112 and 114 that generate input spike signals. The neuron circuits 112 and 114 may perform a function of outputting signals to other neurons, similar to the axon of a biological neural network. For example, each of the neuron circuits 112 and 114 may generate an input spike signal based on data or information input from the outside. The input spike signal may be a pulse signal that toggles for a short period of time. In particular, the neuron circuits 112 and 114 of the present invention may be configured in a stable and simple structure using a flash memory type transistor (FMTR). In particular, the flash memory type transistor FMTR constituting the spike regulator included in the neuron circuits 112 and 114 may arbitrarily adjust a threshold voltage through charge injection. Accordingly, the output characteristic of the spike signal provided by the spike regulator may be adjusted, and stability may be improved.

The synapse array 130 may connect the first neuron array 110 and the second neuron array 150. The synapse array 130 may include synapse circuits 131 that determine whether neuron circuits 112 and 114 of the first neuron array 110 and neurons of the second neuron array 150 are connected and the strength of the connection. The synapse circuits 131 may process spike signals input from the first neuron array 110 and may output a processing result to the second neuron array 150. Devices for configuring the synapse circuits 131 may be devices such as flash memory, RRAM, PRAM, FRAM, and MRAM. However, the devices constituting the synapse circuits 131 may be variously changed, and the present disclosure is not limited thereto.

The neuron circuits 151, 153, and 155 of the second neuron array 150 may receive operation signals to which weights are applied to input spike signals from the synapse array 130, respectively. The neuron circuits 151, 153, and 155 may perform a function of receiving signals output from other neurons, similar to the dendrites of a biological neural network. Referring to FIG. 1, each of the neuron circuits 152, 153, and 155 included in the second neuron array 150 may be connected to synapse circuits 131 and may receive operation signals output from the synapse circuits 131.

Operation signals provided from the synapse circuits 131 may be accumulated in each of the neuron circuits 151, 153, and 155. However, the number and arrangement of the synapse circuits 131 connected to each of the neuron circuits 151, 153, and 155 are not limited to those shown in FIG. 1. Each of neuron circuits 151, 153, and 155 may compare the sum signal in which the operation signals of the synapse circuits 131 are accumulated with a threshold signal (ie, a reference signal), and generate an output spike signal when the sum signal is greater than the threshold signal (namely, neurons fire). The output spike signals of the second neuron array 150 may be provided back to the first neuron array 110, output to the outside of the neuromorphic circuit 100, or output to other components of the neuromorphic circuit 100.

Neuron circuits 151, 153, and 155 may also be configured in a stable and simple structure using a flash memory type transistor FMTR. That is, the flash memory type transistor FMTR constituting the spike regulator included in the neuron circuits 151, 153, and 155 may arbitrarily adjust a threshold voltage through charge injection. Therefore, it is possible to improve the flexibility and stability of the output characteristics of the spike signal output from the neuron circuits 151, 153, and 155.

The control logic 170 may control an operation sequence of the neuromorphic circuit 100. The control logic 170 may control transmission, processing, or update of spike signals of the first and second neuron arrays 110 and 150 and the synapse array 130. In particular, the control logic 170 of the present invention may include a program circuit 175 that performs a program of the flash memory type transistor FMTR included in the first and second neuron arrays 110 and 150.

The program circuit 175 may first program the flash memory type transistors FMTR once in a step for setting the characteristics of the neuromorphic circuit 100. The threshold voltage of the flash memory type transistor FMTR is set by the program operation of the program circuit 175, and the level of the spike signal output from the first and second neuron arrays 110 and 150 may be selected. Alternatively, the program circuit 175 may be activated when necessary according to a user's selection to program the flash memory type transistor FMTR included in the first and second neuron arrays 110 and 150.

In the above, the basic configuration of the neuromorphic circuit 100 of the present invention has been briefly described. In configuring the neuromorphic circuit 100 by hardware, the number of transistors required by the first and second neuron arrays 110 and 150 generating spike signals is relatively large. The first and second neuron arrays 110 and 150 of the present invention may include a simple and low power spike regulator using a flash memory type transistor FMTR.

Figure 2:
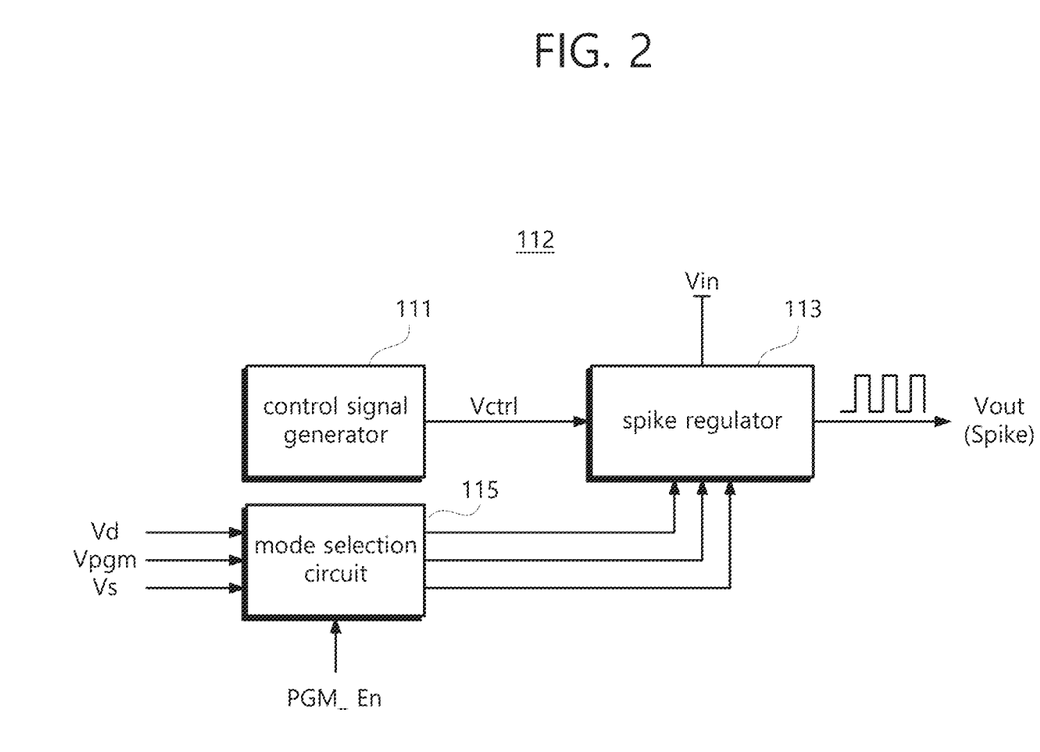
FIG. 2 is a block diagram illustrating a configuration of a neuron circuit illustrated in FIG. 1 by way of example.

FIG. 2 is a block diagram illustrating an exemplary configuration of a neuron circuit illustrated in FIG. 1. Referring to FIG. 2, the neuron circuit 112 may include a control signal generator 111, a spike regulator 113, and a mode selection circuit 115.

The neuron circuit 112 may operate in a normal mode for generating a spike signal and a program mode for programming a flash memory type transistor FMTR included in the spike regulator 113. The normal mode is an operation mode in which the spike regulator 113 outputs the spike signal Vout in response to the control signal Vctrl and the input signal Vin provided from the control signal generator 111. The program mode is an operation in which a mode selection circuit 115 is activated under the control of the program circuit 175 of FIG. 1 described above, and charges are injected into a floating gate of a flash memory type transistor FMTR of a spike regulator 113. The threshold voltage of the flash memory type transistor FMTR may be set through a program operation in which electric charges are injected into a floating gate or a charge trap layer of the flash memory type transistor FMTR.

The control signal generator 111 generates a control signal Vctrl for forming a waveform or a magnitude of a pulse width of the spike signal generated by the neuron circuit 112 in the normal mode. The control signal generator 111 may operate to fire a pre-spike signal corresponding to a membrane potential based on an input spike train provided to the first neuron array 110. At this time, the control signal generator 111 will output a control signal Vctrl pulse corresponding to the input of the spike regulator 113.

The spike regulator 113 outputs a spike signal Vout in the form of a pulse corresponding to the control signal Vctrl at a stable level. The spike regulator 113 may output a spike signal Vout of a constant level regardless of a level fluctuation or noise of the input voltage Vin corresponding to the power supply voltage. In order to perform this operation, the spike regulator 113 of the present invention may include a flash memory type transistor FMTR.

For example, the spike regulator 113 may output a spike signal Vout corresponding to the control signal Vctrl using only one flash memory type transistor FMTR and one switch element. A significant amount of ripple or noise included in the input voltage Vin may be removed by the flash memory type transistor FMTR programmed to have a threshold voltage of a negative voltage. A specific example of the spike regulator 113 will be described in more detail in FIGS. 3 to 11 to be described later.

The mode selection circuit 115 may provide program bias voltages Vd, Vpgm, and Vs for programming the flash memory type transistor FMTR included in the spike regulator 113 in response to the program enable signal PGM_En. In the normal mode, the program circuit 175 (refer to FIG. 1) will disable the program enable signal PGM_En. Accordingly, in the normal mode, the mode selection circuit 115 will cut off the program bias voltages Vd, Vpgm, and Vs. On the other hand, in the program mode, the program circuit 175 will enable the program enable signal PGM_En. Then, the mode selection circuit 115 may provide program bias voltages Vd, Vpgm, and Vs to the flash memory type transistor FMTR of the spike regulator 113.

The program bias voltages Vd, Vpgm, and Vs include voltages for injecting electric charges into the floating gate or charge trap layer of the flash memory type transistor FMTR. The drain voltage Vd is provided to the drain when programming the flash memory type transistor FMTR. The program voltage Vpgm is provided to the gate during programming of the flash memory type transistor FMTR. The source voltage Vs is provided to the source when programming the flash memory type transistor FMTR.

For example, during the program operation, the drain voltage Vd may be provided with a level (about 5V) for increasing the efficiency of hot electron injection, and the source voltage Vs may be provided with the ground level GND. The program voltage Vpgm may be provided as an incremental step pulse that gradually increases during a program operation. It is possible to control the level of the threshold voltage programmed in the flash memory type transistor FMTR by controlling the number of pulses of the program voltage Vpgm, the pulse width, the increase width of the pulse, the duty cycle, etc.

In the above, a simple configuration of the neuron circuit 112 of the present invention has been described. The neuron circuit 112 has been described as being included in the first neuron array 110 corresponding to the pre-synapse neuron of FIG. 1. However, it will be well understood the configuration of the neuron circuit 112 may be equally applied to the neuron circuit 114 and the neuron circuits 151, 153, and 155 constituting the second neuron array 150 corresponding to the post neuron of FIG. 1.

Figure 3:
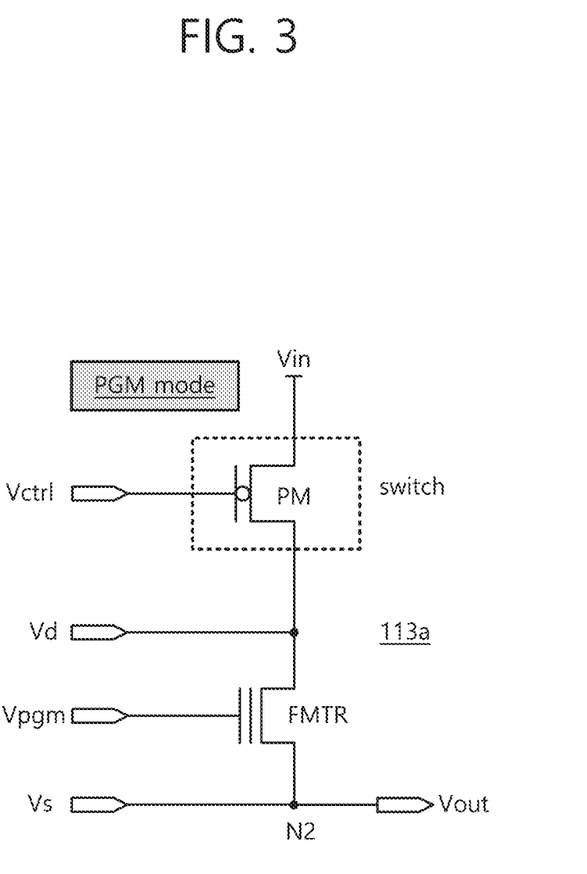
FIG. 3 is a circuit diagram showing an embodiment of the spike regulator of FIG. 2 in a program mode.

FIG. 3 is a circuit diagram showing an embodiment of the spike regulator of FIG. 2 in a program mode. Referring to FIG. 3, the spike regulator 113*a* includes a PMOS transistor PM that functions as a switch and a flash memory type transistor FMTR.

In the normal mode, by the PMOS transistor PM and the flash memory type transistor FMTR, the spike regulator 113*a* may generate a spike signal Vout having a constant target amplitude regardless of ripple or noise included in the input voltage Vin.

In the program mode, the flash memory type transistor FMTR of the spike regulator 113*a* is provided with program bias voltages Vd, Vpgm, and Vs provided through the mode selection circuit 115 (refer to FIG. 2). In the program mode, the control signal Vctrl is provided at a high level, so that the PMOS transistor PM may maintain a turn-off state.

In the program mode, the program voltage Vpgm is provided to the gate of the flash memory type transistor FMTR, the drain voltage Vd is provided to the drain, and the source voltage Vs is provided to the source. The source voltage Vs and the bulk region are grounded. And in the state where the drain voltage Vd at the level for hot electron injection is provided, negative charges are injected into the floating gate or charge trap layer of the flash memory transistor FMTR adjacent to the drain by the program voltage Vpgm provided in the form of a pulse.

The injection amount of negative charges may be controlled through the number of pulses, the pulse width, the width of the step pulse, the duty cycle, etc of the program voltage Vpgm. The threshold voltage level of the flash memory type transistor FMTR is set according to the injection amount of negative charge. The flash memory type transistor FMTR of the present invention may have a threshold voltage of a negative level through execution of the program mode.

When the program mode is completed, the mode selection circuit 115 is deactivated, and the program bias voltages Vd, Vpgm, Vs will be cut off. Then, the spike regulator 113a may operate in a normal mode for outputting a spike signal.

Figure 4:
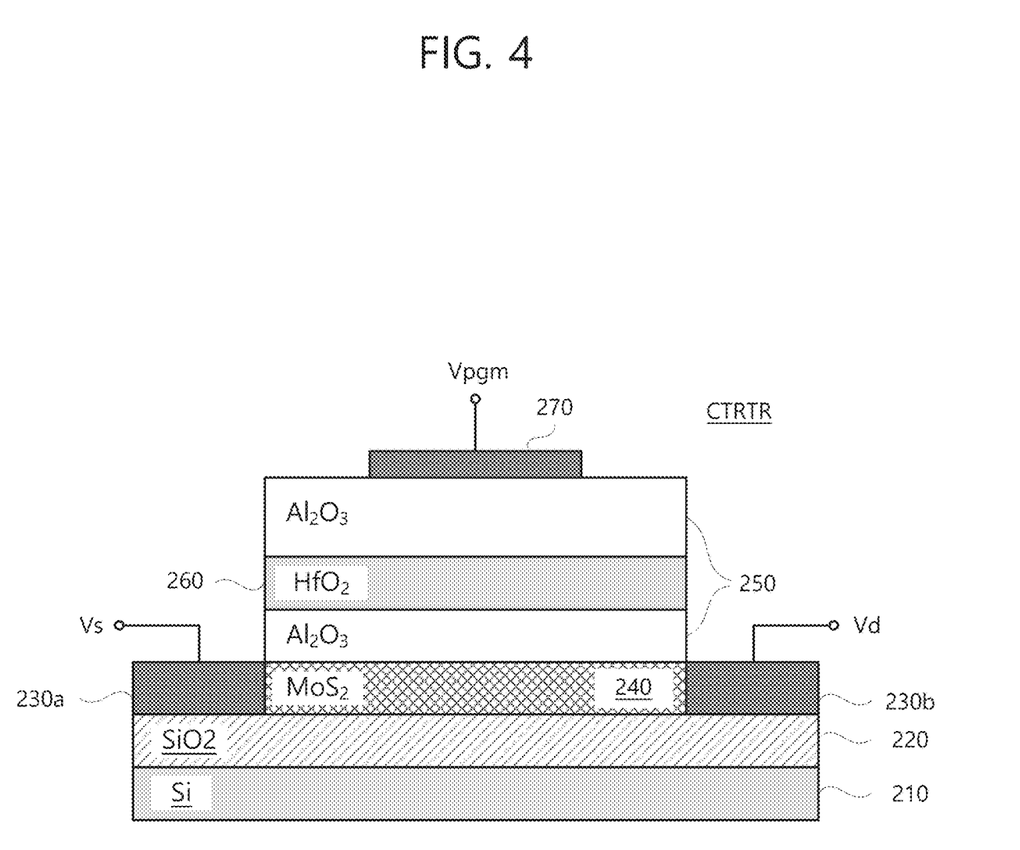
FIG. 4 is a cross-sectional view showing an exemplary structure of a flash memory type transistor (FGTR) of the present invention.

FIG. 4 is a cross-sectional view showing an exemplary structure of a flash memory type transistor FMTR according to the present invention. Referring to FIG. 4, a structure of a charge trap flash transistor CTFTR is disclosed as an example of a flash memory type transistor FMTR. The charge trap type flash transistor CTFTR may include the substrate 210, the insulating layer 220, the drain electrode 230a, the source electrode 230b, the channel layer 240, the charge trap layers 250 and 260, and the gate electrode 270.

A channel layer 240 may be formed between the drain electrode 230a and source electrode 230b on the substrate 210 formed of silicon (Si) and the insulating layer 220 to configure the charge trap type flash transistor CTFTR. The channel layer 240 may be formed of a single layer or a multi-layer of molybdenum disulfide MoS2. The drain electrode 230a and source electrode 230b may be formed of gold (Au). The channel layer 240 of molybdenum disulfide MoS2 forming a single-layer or multi-layer may be provided between the drain electrode 230a and source electrode 230b. Two layers 250 of aluminum oxide (AL2O3) may be formed between the gate electrode 270 and the channel layer 240. A hafnium oxide (HfO2) layer 260 is stacked between the two layers 250 of aluminum oxide (AL2O3). So a three-dimensional charge trapping layer 250 and 260 may be formed.

The charge trap type flash transistor CTFTR having the above-described structure may inject charges (electrons or holes) into a hafnium oxide (HfO2) layer 260 through a program. For example, under conditions of a source voltage (Vs) of a ground level and a drain voltage (Vd) of 5V, when a high voltage program pulse is provided to the gate electrode 270, electrons may be trapped in the hafnium oxide (HfO2) layer 260. In this case, the threshold voltage Vth_FMTR of the charge trap type flash transistor CTFTR increases.

On the other hand, when a high voltage is applied to the bulk region, electrons trapped in the hafnium oxide (HfO2) layer 260 are released and holes increase. In this case, the threshold voltage Vth_FMTR of the charge trap type flash transistor CTFTR is lowered. Through such a program or erase operation, the charge trap type flash transistor CTFTR may have a threshold voltage Vth_FMTR characteristic in a negative region. Here, it will be well understood that the 2D material provided as the channel layer 240 is not limited to molybdenum disulfide (MoS2).

In the above, the charge trap type flash transistor CTFTR has been briefly described as an example of the flash memory type transistor FMTR of the present invention. However, the charge trap type flash transistor CTFTR is not limited to the above-described materials or structures, and various types of charge trap type transistors that may be set to a negative threshold voltage through a program may be used. In addition, it will be well understood that the flash memory type transistor FMTR may be implemented not only as a charge trap type flash transistor CTFTR but also as a floating gate type flash transistor.

Figure 5:
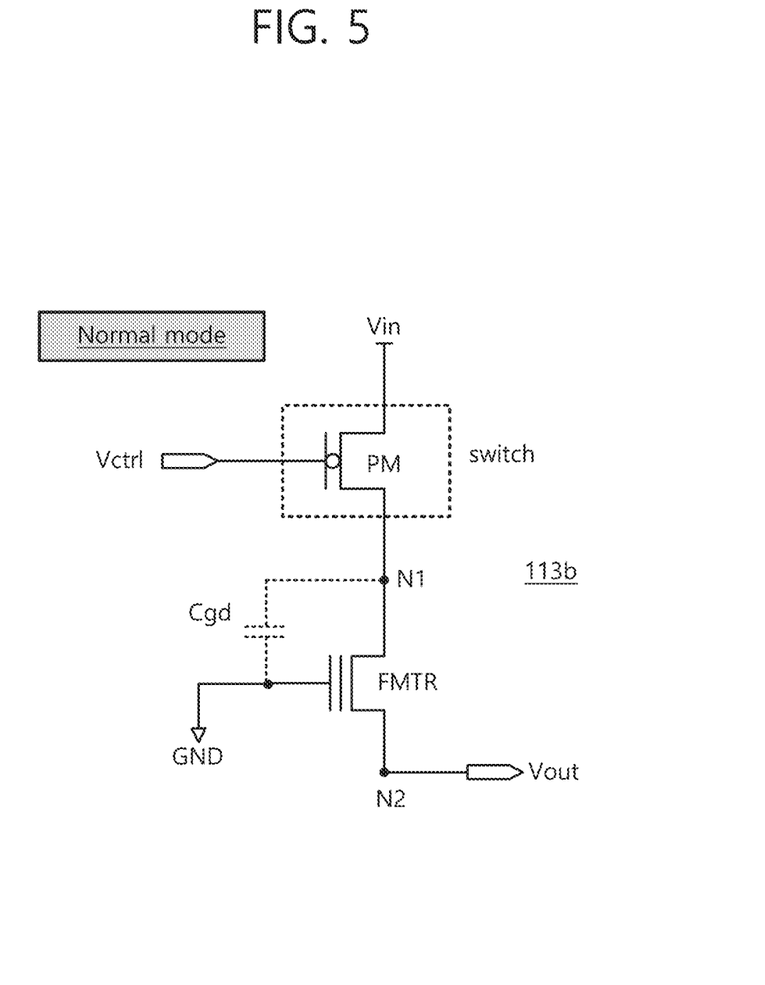
FIG. 5 is a circuit diagram illustrating an example of a normal mode operation of the spike regulator of FIG. 2.

FIG. 5 is a circuit diagram illustrating an example of a normal mode operation of the spike regulator of FIG. 2. Referring to FIG. 5, the spike regulator 113b includes a PMOS transistor PM that functions as a switch and a flash memory type transistor FMTR. The spike regulator 113b may generate a spike signal Vout having a constant target amplitude regardless of ripple or noise included in the input voltage Vin by the PMOS transistor PM and the flash memory type transistor FMTR.

The PMOS transistor PM performing the switch function switches the input voltage Vin in response to the control signal Vctrl. That is, the PMOS transistor PM may convert the control signal Vctrl into the level of the input voltage Vin provided as the power supply voltage and transmit it to the source terminal. However, a signal having an inverted waveform of the control signal Vctrl will be transmitted to the source terminal (corresponding to node N1) of the PMOS transistor PM.

The flash memory type transistor FMTR may have a threshold voltage Vth_FMTR in a negative region through application of a program mode. The flash memory type transistor FMTR filters the switched voltage provided through the drain terminal (corresponding to the node N1) and outputs a spike signal Vout to the source terminal. In this case, the gate terminal of the flash memory type transistor FMTR may be provided as a ground voltage GND.

If the input voltage Vin is unstable, it is assumed that noise or ripple exists. Then, the voltage switched by the PMOS transistor PM will be provided to the drain terminal N1 of the flash memory type transistor FMTR. For example, the voltage at the drain terminal N1 of the flash memory type transistor FMTR may include a ripple voltage. This ripple voltage provides interference to the gate terminal of the flash memory type transistor FMTR by a parasitic capacitance Cgd between the gate terminal and the drain terminal of the flash memory type transistor FMTR. An interference component due to a ripple voltage, which is an AC component, will be transmitted to the gate terminal of the flash memory type transistor FMTR by the parasitic capacitance Cgd.

Accordingly, a ripple voltage due to interference may be included in the gate terminal of the flash memory type transistor FMTR. However, the gate terminal of the flash memory type transistor FMTR is connected to the ground voltage GND. Accordingly, a significant portion of the ripple voltage transmitted to the gate terminal due to interference falls to the ground side providing the ground voltage GND, and the voltage at the gate terminal will maintain the ground level. The level of the spike signal Vout formed at the source terminal N2 of the flash memory type transistor FMTR will be the difference between the gate voltage GND and the threshold voltage (GND−Vth_FMTR and Vth_FMTR are negative numbers). That is, the level of the spike signal Vout will have the level of the threshold voltage Vth_FMTR of the flash memory type transistor FMTR.

According to the above-described feature, when a switched signal is provided to the drain electrode N1 of the flash memory type transistor FMTR, the spike signal Vout corresponding to the voltage at the source terminal of the flash memory type transistor FMTR may be output as a stable level.

Figure 6:
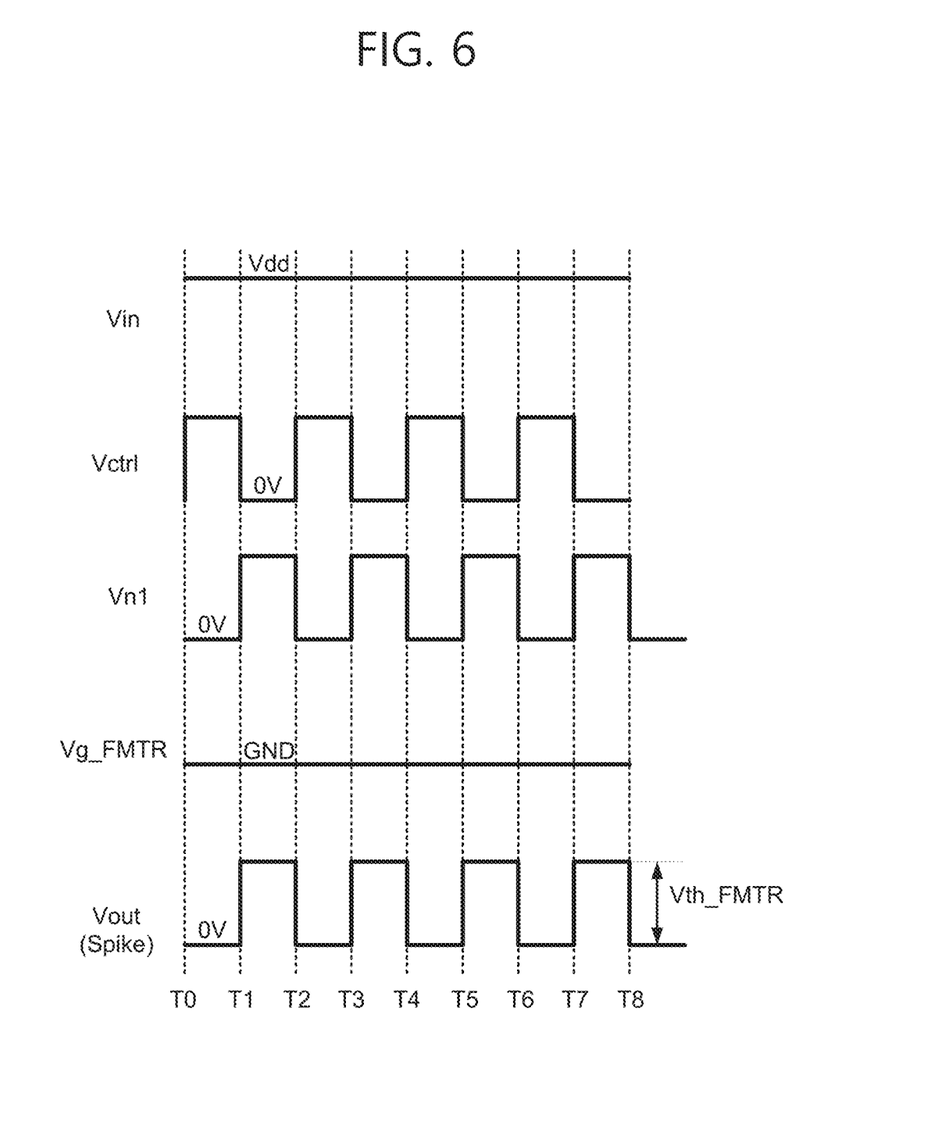
FIG. 6 is a timing diagram illustrating the operation of the spike regulator of FIG. 5.

FIG. 6 is a timing diagram illustrating the operation of the spike regulator of FIG. 5. Referring to FIG. 6, a spike signal Vout output from the spike regulator 113a under an input voltage Vin condition in which ripple or noise is not included is shown.

The input voltage Vin is provided at the power supply voltage Vdd level without ripple or noise. Then, the PMOS transistor PM inverts the signal having the input voltage Vin amplitude by the gate voltage provided as the control signal Vctrl and outputs it to the source terminal N1 of the PMOS transistor PM. The source terminal N1 of the PMOS transistor PM corresponds to the drain terminal N1 of the flash memory type transistor FMTR. Accordingly, the voltage Vn1 of the drain terminal N1 of the flash memory type transistor FMTR is provided in a form in which the input voltage Vin is inverted.

Since noise or ripple does not exist in the input voltage Vin, interference between the gate terminal and the drain terminal of the flash memory type transistor FMTR will be insignificant. Accordingly, the voltage at the gate terminal of the flash memory type transistor FMTR will maintain a stable ground level GND. Since the voltage (Vg_FMTR) at the gate terminal of the flash memory type transistor FMTR maintains the ground level (GND), the spike signal Vout formed at the source terminal N2 of the flash memory type transistor FMTR may be output as a pulse signal having an amplitude of the absolute value Vth_FMTR of the threshold voltage of the flash memory type transistor FMTR.

Figure 7:
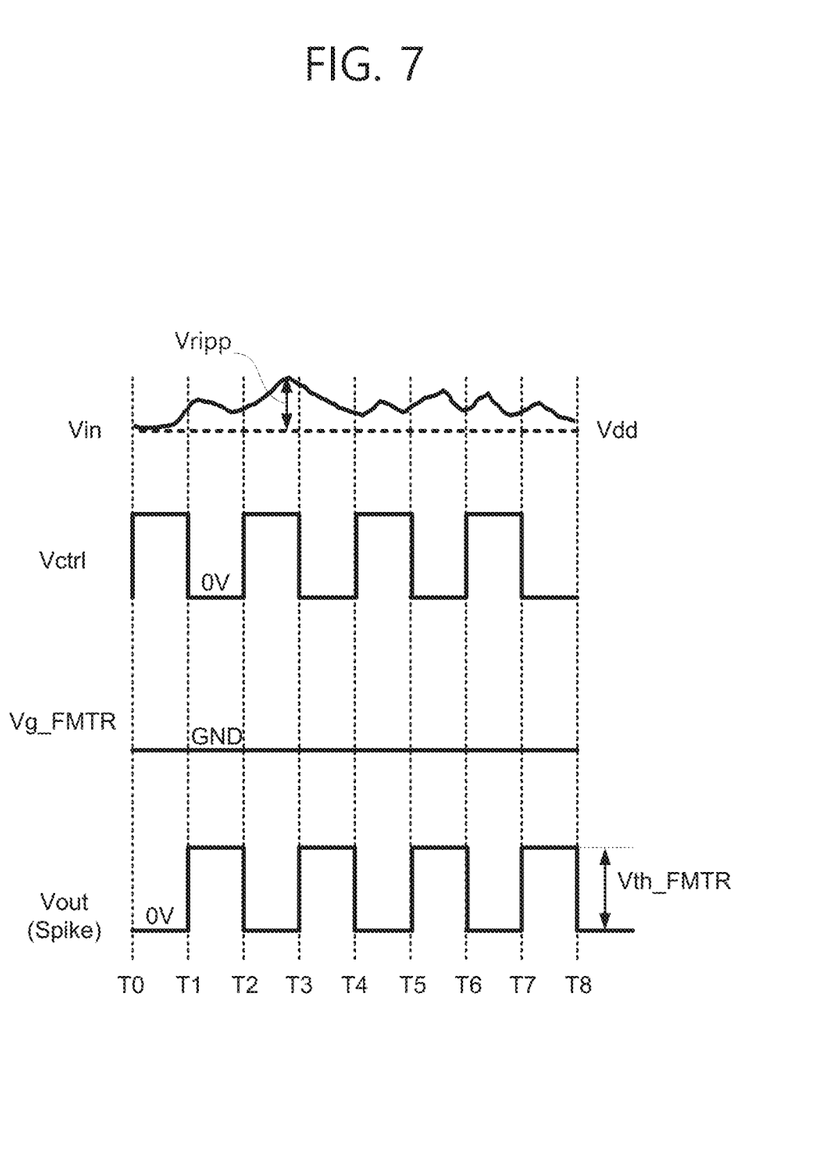
FIG. 7 is a timing diagram showing another characteristic of the spike regulator of FIG. 5.

FIG. 7 is a timing diagram showing another characteristic of the spike regulator of FIG. 5. Referring to FIG. 7, a spike signal Vout output from the spike regulator 113b under an input voltage Vin condition including a ripple voltage Vripp is shown.

When the input voltage Vin is unstable or contains ripple or noise under certain operating conditions, the ripple voltage Vripp is added to the original power supply voltage Vdd. Then, the PMOS transistor PM inverts the signal having the input voltage Vin amplitude by the gate voltage provided as the control signal Vctrl and outputs it to the source terminal N1 of the PMOS transistor PM. The source terminal N1 corresponds to the drain terminal N1 of the flash memory type transistor FMTR. Accordingly, the voltage Vn1 of the drain terminal N1 of the flash memory type transistor FMTR is provided in a form in which the input voltage Vin is inverted. In addition, a ripple component will also be included in the voltage Vn1 of the drain terminal N1 of the flash memory type transistor FMTR.

The voltage at the drain terminal N1 of the flash memory type transistor FMTR may include a ripple voltage. This ripple voltage acts as an interference to the gate terminal of the flash memory type transistor FMTR by a parasitic capacitance Cgd between the gate terminal and the drain terminal of the flash memory type transistor FMTR. An interference component due to a ripple voltage, which is an AC component, by the parasitic capacitance Cgd will be transmitted to the gate terminal of the flash memory type transistor FMTR.

Accordingly, a ripple voltage may be transmitted to the gate terminal of the flash memory type transistor FMTR. However, the gate terminal of the flash memory type transistor FMTR is connected to the ground voltage GND. Accordingly, a significant portion of the ripple voltage transmitted to the gate terminal of the flash memory type transistor FMTR due to interference falls to the ground side, and the voltage at the gate terminal will maintain the ground level. By grounding the gate terminal of the flash memory type transistor FMTR, the level of the spike signal Vout formed at the source terminal N2 of the flash memory type transistor FMTR will be the difference (0−Vth_FMTR, Vth_FMTR is negative) between the ground voltage (GND, 0V) and the threshold voltage. Accordingly, even if ripple or noise exists in the input voltage Vin, the spike signal Vout may be generated in the form of a stable pulse having an amplitude of the threshold voltage Vth_FMTR of the flash memory type transistor FMTR.

Figure 8:
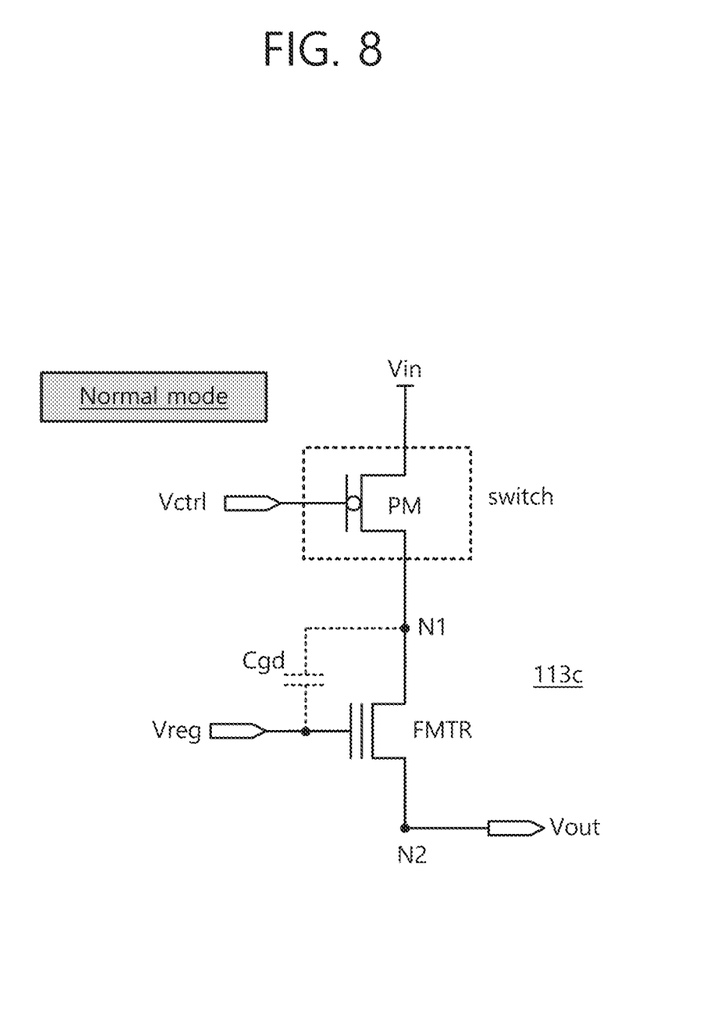
FIG. 8 is a circuit diagram showing another embodiment of the spike regulator of FIG. 2.

FIG. 8 is a circuit diagram showing another embodiment of the spike regulator of FIG. 2. Referring to FIG. 8, the spike regulator 113c includes a PMOS transistor PM that functions as a switch and a flash memory type transistor FMTR that receives an ungrounded gate voltage. The spike regulator 113c may generate a spike signal Vout having a constant target amplitude regardless of ripple or noise included in the input voltage Vin by the PMOS transistor PM and the flash memory type transistor FMTR.

The PMOS transistor PM performing the switch function switches the input voltage Vin in response to the control signal Vctrl. That is, the PMOS transistor PM may convert the control signal Vctrl into the level of the input voltage Vin provided as the power supply voltage and transmit it to the source terminal. However, a signal having an inverted waveform of the control signal Vctrl will be transmitted to the source terminal (corresponding to node N1) of the PMOS transistor PM.

The flash memory type transistor FMTR filters the switched voltage provided through the drain terminal (corresponding to the node N1) and outputs a spike signal Vout to the source terminal. In this case, a regulator voltage Vreg of a specific level, not a ground voltage GND, may be provided to the gate terminal of the flash memory type transistor FMTR.

If the input voltage Vin is unstable, it is assumed that noise or ripple is included. Then, the voltage switched by the PMOS transistor PM will be provided to the drain terminal N1 of the flash memory type transistor FMTR. For example, the voltage at the drain terminal N1 of the flash memory type transistor FMTR may include a ripple voltage. This ripple voltage provides interference to the gate voltage Vreg of the flash memory type transistor FMTR due to a parasitic capacitance Cgd between the gate terminal and the drain terminal of the flash memory type transistor FMTR. The ripple voltage will be transmitted to the gate terminal of the flash memory type transistor FMTR due to interference such as a coupling effect.

Accordingly, the ripple voltage component may be included in the gate voltage Vreg of the flash memory type transistor FMTR. However, the magnitude of the ripple voltage transmitted to the gate voltage Vreg of the flash memory type transistor FMTR will be significantly reduced and transmitted. The level of the spike signal Vout formed at the source terminal N2 of the flash memory type transistor FMTR will be the difference (Vreg−Vth_FMTR and Vth_FMTR are negative numbers) between the gate voltage Vreg and the threshold voltage.

According to the above-described feature, when a switched signal is provided to the drain electrode N1 of the flash memory type transistor FMTR, the spike signal Vout corresponding to the voltage at the source terminal of the flash memory type transistor FMTR may be output as a stable level. Of course, in this case, the level of the input voltage Vin should be higher than 'Vreg−Vth_FMTR'.

Figure 9:
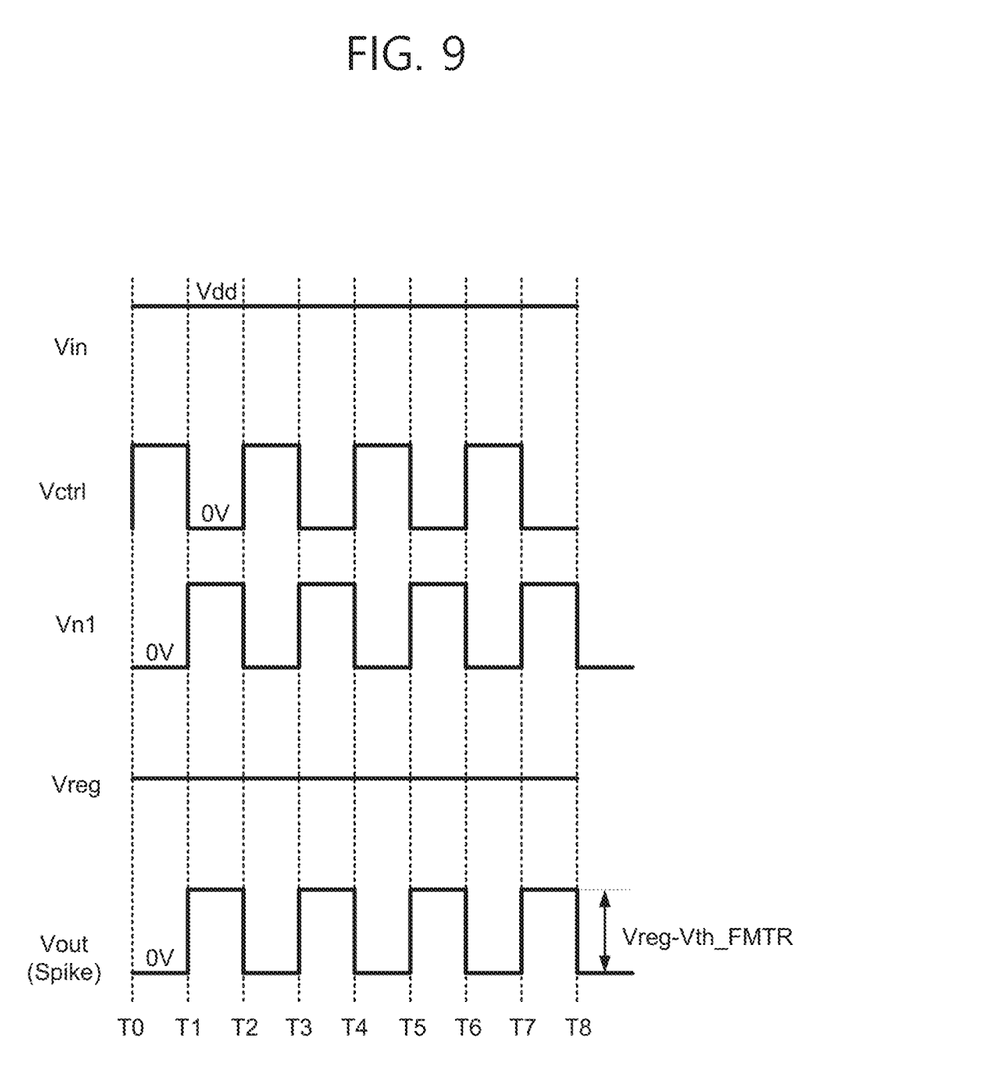
FIG. 9 is a timing diagram showing the operation of the spike regulator of FIG. 8.

FIG. 9 is a timing diagram showing the operation of the spike regulator of FIG. 8. Referring to FIG. 9, under an input voltage Vin condition in which ripple or noise is not included, a spike signal Vout output from the spike regulator 113c is shown.

The PMOS transistor PM inverts a signal having an amplitude of the input voltage Vin by the gate voltage provided as the control signal Vctrl and outputs it to the source terminal N1 of the PMOS transistor PM. The source terminal N1 of the PMOS transistor PM corresponds to the drain terminal N1 of the flash memory type transistor FMTR. Accordingly, the voltage Vn1 of the drain terminal N1 of the flash memory type transistor FMTR is provided in a form in which the input voltage Vin is inverted.

The input voltage Vin is shown to be provided at the power supply voltage Vdd level without ripple or noise. However, even if the input voltage Vin contains ripple or noise, a spike signal Vout of a stable level may be output due to the action of the flash memory type transistor FMTR. That is, the amplitude of the output spike signal Vout will correspond to 'Vreg−Vth_FMTR'. Of course, in this case, the level of the input voltage Vin should be higher than 'Vreg−Vth_FMTR'.

Figure 10:
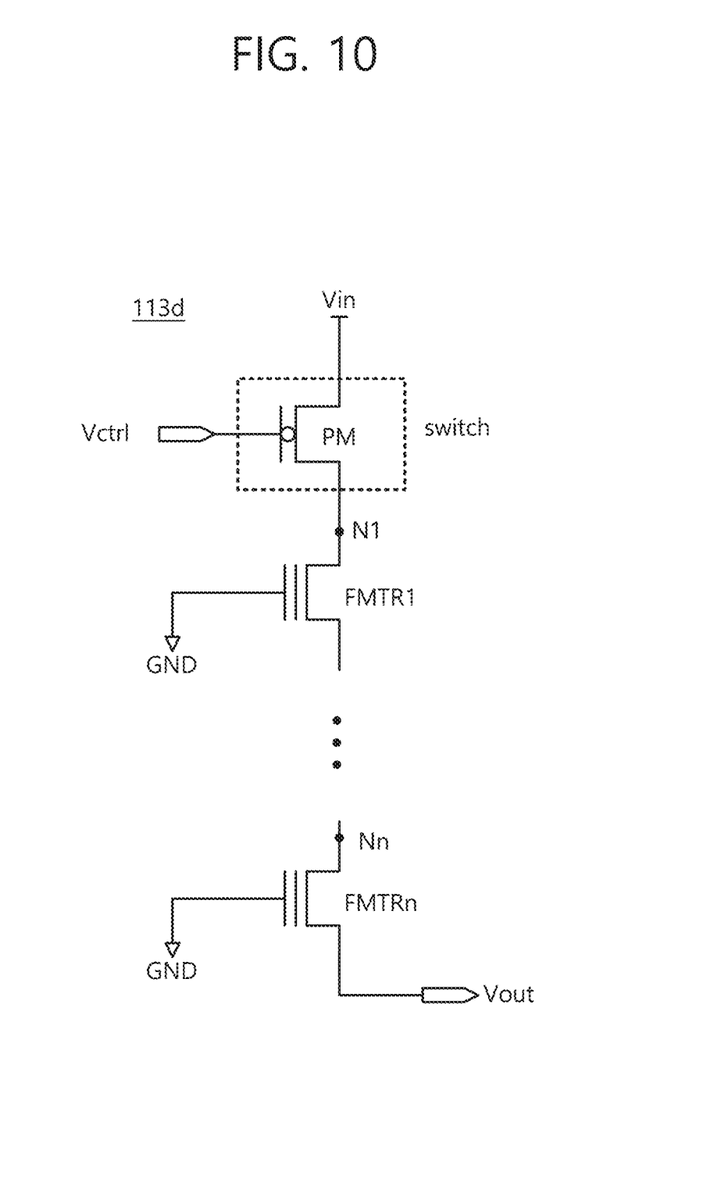
FIG. 10 is a circuit diagram showing another embodiment of the spike regulator of FIG. 2.

FIG. 10 is a circuit diagram showing another embodiment of the spike regulator of FIG. 2. Referring to FIG. 10, the spike regulator 113d includes a plurality of floating gate transistors FMTR1 to FMTRn connected in series with a PMOS transistor PM performing a function of a switch. By means of a PMOS transistor (PM) and a plurality of floating gate transistors (FMTR1 to FMTRn), the spike regulator 113d may generate a spike signal Vout having a constant amplitude regardless of ripple or noise included in the input voltage Vin.

The PMOS transistor PM performing the switch function switches the input voltage Vin in response to the control signal Vctrl. That is, the PMOS transistor PM may convert the control signal Vctrl into the level of the input voltage Vin provided as the power supply voltage and transmit it to the source terminal. However, a signal having an inverted waveform of the control signal Vctrl will be transmitted to the source terminal (corresponding to node N1) of the PMOS transistor PM.

The plurality of floating gate transistors FMTR1 to FMTRn may filter the switched voltage provided through the node N1 in a chain or cascade form to output a spike signal Vout. At this time, the gate terminals of the plurality of floating gate transistors FMTR1 to FMTRn are grounded.

A plurality of floating gate transistors FMTR1 to FMTRn connected in a cascade form may be used for noise filtering or generating a spike signal Vout of an appropriate target level. Here, the operation characteristics of each of the plurality of floating gate transistors FMTR1 to FMTRn are the same as the operation of the flash memory type transistor FMTR described in FIG. 5, and thus will be omitted.

According to the above-described features, the spike regulator 113d according to the present invention may generate a spike signal Vout having a stable level even against ripple or noise.

Figure 11:
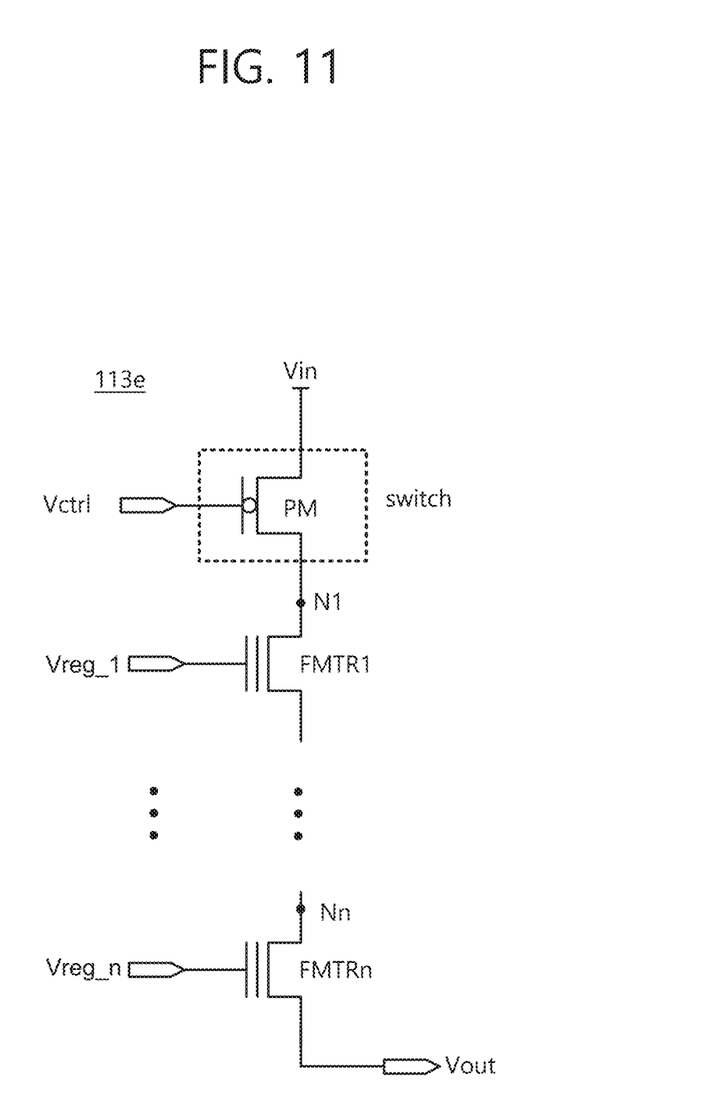
FIG. 11 is a circuit diagram illustrating another embodiment of the spike regulator of FIG. 2.

FIG. 11 is a circuit diagram illustrating another embodiment of the spike regulator of FIG. 2. Referring to FIG. 11, the spike regulator 113e includes a plurality of floating gate transistors FMTR1 to FMTRn connected in series with a PMOS transistor PM performing a function of a switch. In this case, regulator voltages Vreg_1 to Vreg_n of a specific level other than a ground level may be provided to gate terminals of the plurality of floating gate transistors FMTR1 to FMTRn.

The PMOS transistor PM performing the switch function switches the input voltage Vin in response to the control signal Vctrl. That is, the PMOS transistor PM may convert the control signal Vctrl into the level of the input voltage Vin provided as the power supply voltage and transmit it to the source terminal. However, a signal having an inverted waveform of the control signal Vctrl will be transmitted to the source terminal (corresponding to node N1) of the PMOS transistor PM.

The plurality of floating gate transistors FMTR1 to FMTRn may filter the switched voltage provided through the node N1 in a chain or cascade form to output a spike signal Vout. In this case, each of the gate terminals of the plurality of floating gate transistors FMTR1 to FMTRn may be provided with regulator voltages Vreg_1 to Vreg_n other than the ground level. Here, the regulator voltages Vreg_1 to Vreg_n may be provided at the same level or different levels.

A plurality of floating gate transistors FMTR1 to FMTRn connected in a cascade form may be used for noise filtering or generating a spike signal Vout of an appropriate target level. Here, the operation characteristics of each of the plurality of floating gate transistors FMTR1 to FMTRn are the same as those of the flash memory type transistor FMTR described in FIG. 8, and thus will be omitted. According to the above-described features, the spike regulator 113e according to the present invention may generate a spike signal Vout having a stable level even against ripple or noise.

The above-described contents are specific examples for carrying out the present invention. Although exemplary embodiments of the present disclosure have been described for illustrative purposes, those skilled in the art will appreciate that various modifications, additions and substitutions are possible, without departing from the scope and spirit of the disclosure. Therefore, exemplary embodiments of the present disclosure have not been described for limiting purposes. Accordingly, the scope of the disclosure is not to be limited by the above embodiments but by the claims and the equivalents thereof.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present disclosure". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

What is claimed is:

1. A neuromorphic circuit comprising:
   a control signal generator for generating a control signal for generating a pulse signal; and
   a spike regulator for generating a spike signal in response to the control signal,
   wherein the spike regulator comprises:
   a first transistor for switching an input signal transmitted to one terminal to another terminal in response to the control signal; and
   a first flash memory type transistor having a drain terminal connected to the other terminal of the first transistor and transferring the switched input signal to a source terminal as the spike signal.

2. The neuromorphic circuit of claim 1, wherein the first transistor includes a PMOS transistor, and the control signal is provided to a gate terminal of the PMOS transistor.

3. The neuromorphic circuit of claim 1, wherein a gate of the first flash memory type transistor is grounded.

4. The neuromorphic circuit of claim 1, wherein the first flash memory type transistor includes a channel layer formed of molybdenum disulfide (MoS2), and a three-dimensional charge trapping layer in which aluminum oxide (AL2O3) and hafnium oxide (HfO2) layers are stacked.

5. The neuromorphic circuit of claim 1, further comprising:
   a program circuit for setting a level of a threshold voltage of the first flash memory type transistor.

6. A neuromorphic circuit comprising:
   a neuron array including neuron circuits that generate spike signals; and
   a synapse array including synapse circuits for processing and outputting the spike signals,
   wherein each of the neuron circuits comprises:
   a control signal generator for generating a control signal for generating a pulse signal;
   a spike regulator generating the spike signals in response to the control signal; and
   a mode selection circuit for selecting an operation mode of the spike regulator, and
   wherein the spike regulator comprises:
   a first transistor for switching an input signal transmitted to one terminal to another terminal in response to the control signal; and
   a first flash memory type transistor having a drain terminal connected to the other terminal of the first transistor and transferring the switched input signal to a source terminal as a spike signal.

7. The neuromorphic circuit of claim 6, wherein, in the program mode of the first flash memory type transistor, the mode selection circuit provides a program voltage to a gate terminal of the first flash memory type transistor.

8. The neuromorphic circuit of claim 7, further comprising:
   a program circuit generating the program voltage and transmitting the program voltage to the mode selection circuit.

9. The neuromorphic circuit of claim 6, wherein the first transistor includes a PMOS transistor, and the control signal is provided to a gate terminal of the PMOS transistor.

10. The neuromorphic circuit of claim 6, wherein the first flash memory type transistor includes a channel layer formed of molybdenum disulfide (MoS2), and a three-dimensional charge trapping layer in which aluminum oxide (AL2O3) and hafnium oxide (HfO2) layers are stacked.

11. The neuromorphic circuit of claim 6, wherein, in a normal mode, a gate terminal of the first flash memory type transistor is grounded.

12. The neuromorphic circuit of claim 6, wherein, in a normal mode, a regulator voltage Vreg is provided to a gate terminal of the first flash memory type transistor, and a level of the input signal is higher than a difference between the regulator voltage and the threshold voltage of the first flash memory type transistor.

13. The neuromorphic circuit of claim 6, further comprising:
   at least one second flash memory type transistor connected in series to the first flash memory type transistor.

14. The neuromorphic circuit of claim 13, wherein gate terminals of the at least one second flash memory type transistor are grounded.

15. A spike regulator of a neuromorphic circuit comprising:
   a PMOS transistor for switching an input signal in response to a control signal; and
   a first flash memory type transistor configured to output the switched input signal transmitted from the PMOS transistor as a spike signal.

16. The spike regulator of a neuromorphic circuit of claim 15, wherein a gate terminal of the first flash memory type transistor is grounded.

17. The spike regulator of a neuromorphic circuit of claim 15, wherein a regulator voltage is provided to a gate terminal of the first flash memory type transistor, and a level of the input signal is higher than a difference between the regulator voltage and a threshold voltage of the first flash memory type transistor.

18. The spike regulator of a neuromorphic circuit of claim 15, further comprising:
   at least one second flash memory type transistor connected in series to the first flash memory type transistor.

19. The spike regulator of a neuromorphic circuit of claim 18, wherein a gate terminal of the at least one second flash memory type transistor is grounded.

20. The spike regulator of a neuromorphic circuit of claim 15, wherein the first flash memory type transistor includes a channel layer formed of molybdenum disulfide (MoS2), and a three-dimensional charge trapping layer in which aluminum oxide (AL2O3) and hafnium oxide (HfO2) layers are stacked.

* * * * *